United States Patent
Rong et al.

(10) Patent No.: US 8,450,186 B2
(45) Date of Patent: May 28, 2013

(54) OPTICAL MODULATOR UTILIZING WAFER BONDING TECHNOLOGY

(75) Inventors: Haisheng Rong, Pleasanton, CA (US); Ansheng Liu, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 445 days.

(21) Appl. No.: 12/567,645

(22) Filed: Sep. 25, 2009

(65) Prior Publication Data

US 2011/0073989 A1   Mar. 31, 2011

(51) Int. Cl.
*H01L 21/46* (2006.01)

(52) U.S. Cl.
USPC ........... 438/459; 438/455; 438/478; 438/479; 438/31; 438/22; 257/532; 257/E21.211

(58) Field of Classification Search
USPC ...... 438/459, 455, 478, 479, 31, 22; 257/532, 257/E21.211
See application file for complete search history.

(56) References Cited

U.S. PATENT DOCUMENTS

| | | | |
|---|---|---|---|
| 4,093,345 A | 6/1978 | Logan et al. | |
| 4,923,264 A | 5/1990 | Langer et al. | |
| 4,958,898 A | 9/1990 | Friedman et al. | |
| 5,007,062 A | 4/1991 | Chesnoy | |
| 5,388,106 A | 2/1995 | Tabuchi | |
| 5,661,825 A | 8/1997 | Van Dam et al. | |
| 5,838,844 A | 11/1998 | Van Dam et al. | |
| 5,933,554 A | 8/1999 | Leuthold et al. | |
| 6,052,498 A | 4/2000 | Paniccia | |
| 6,147,366 A | 11/2000 | Drottar et al. | |
| 6,222,963 B1 | 4/2001 | Grand et al. | |
| 6,393,169 B1 | 5/2002 | Paniccia et al. | |
| 6,434,289 B1 | 8/2002 | Paniccia et al. | |
| 6,600,842 B2 | 7/2003 | Yamada | |
| 6,753,996 B2 | 6/2004 | Shibata et al. | |
| 6,801,676 B1 | 10/2004 | Liu | |

(Continued)

FOREIGN PATENT DOCUMENTS

| | | |
|---|---|---|
| CN | 101507065 | 8/2009 |
| EP | 0717482 | 6/1996 |

(Continued)

OTHER PUBLICATIONS

Chen, X., et al., "Silicon Photonic Crystal Modulation Device Based on Horizontally Activated MOS Capacitor", *Microelectronics Research Center, Department of Electrical and Computer Engineering, The University of Texas, at Austin*, Austin, Texas, 3 pp.

(Continued)

*Primary Examiner* — Junghwa M Im
(74) *Attorney, Agent, or Firm* — Blakely, Sokoloff, Taylor & Zafman LLP

(57) ABSTRACT

Optical modulator utilizing wafer bonding technology. An embodiment of a method includes etching a silicon on insulator (SOI) wafer to produce a first part of a silicon waveguide structure on a first surface of the SOI wafer, and preparing a second wafer, the second wafer including a layer of crystalline silicon, the second wafer including a first surface of crystalline silicon. The method further includes bonding the first surface of the second wafer with a thin oxide to the first surface of the SOI wafer using a wafer bonding technique, wherein a second part of the silicon waveguide structure is etched in the layer of crystalline silicon.

8 Claims, 6 Drawing Sheets

U.S. PATENT DOCUMENTS

| | | | |
|---|---|---|---|
| 6,835,633 | B2 | 12/2004 | Boyd et al. |
| 6,879,738 | B2 | 4/2005 | Liu |
| 7,006,717 | B2 | 2/2006 | Liu et al. |
| 7,177,489 | B2 | 2/2007 | Keyser et al. |
| 7,495,266 | B2 | 2/2009 | Isaacson |
| 7,501,326 | B2 | 3/2009 | Hwang |
| 2002/0051601 | A1 | 5/2002 | Hung |
| 2002/0071621 | A1 | 6/2002 | Yamada |
| 2002/0089711 | A1 | 7/2002 | Conzone et al. |
| 2002/0191886 | A1 | 12/2002 | Castoldi et al. |
| 2003/0002767 | A1 | 1/2003 | Hanneman, Jr. |
| 2004/0165807 | A1 | 8/2004 | Liu |
| 2008/0002929 | A1* | 1/2008 | Bowers et al. .......... 385/15 |
| 2009/0080826 | A1 | 3/2009 | Green et al. |
| 2010/0246617 | A1* | 9/2010 | Jones .......... 372/26 |

FOREIGN PATENT DOCUMENTS

| | | |
|---|---|---|
| JP | 9043557 | 2/1997 |
| JP | 2000-269538 | 9/2000 |
| JP | 2005-321588 | 11/2005 |
| JP | 2007-041122 A | 2/2007 |
| KR | 10-2006-0026847 | 3/2006 |
| KR | 10-0810665 B1 | 3/2008 |

OTHER PUBLICATIONS

Dell'Olio, Frencesco , et al., "Silicon-on-Insulator MOS Optical Modulators: a Multiphysics Modeling", *Excert from the Proceedings of the COMSOL Users Conference*, Milano 2006, 5 pp.

Fang, A. , et al., "A Continuous Wave Hybrid AlGaInAs-Silicon Evanescent Laser", *IEEE Photonics Technology Letters 18*, 2006, pp. 1143-1145.

Isaacson, D. , et al., "Strained Silicon on Silicon by Wafer Bonding and Layer Transfer from Relaxed SiGe Buffer", *The Electrochemical Society, Inc., ABS 1357, 206th Meeting*, 2004, 1 page.

Liao, Ling , et al., "High Speed Metal-Oxide-Semiconductor Capacitor-Based Silicon Optical Modulators", *Japanese Journal of Applied Physics*, vol. 45, Aug. 22, 2006, pp. 6603-6608.

Liao, L. , et al., "High Speed Silicon Mach-Zehnder Modulator", *Optics Express*, vol. 13, Issue 8, 2005, pp. 3129-3135.

Liu, Ansheng , et al., "A High-Speed Silicon Optical Modulator Based on a Metal-Oxide-Semiconductor Capacitor", *Letter to Nature, Nature 427*, Feb. 12, 2004, pp. 615-618.

Liu, Ansheng , et al., "High-Speed Optical Modulation Based on Carrier Depletion in a Silicon Waveguide", *Optical Society of America*, 2007, 9 pp.

Rabold, M. , et al., "Low Temperature Wafer Bonding: Plasma Assisted Silicon Direct Binding vs. Silicon-Gold Eutectic Bonding", *University of Freiburg-IMTEK, Department of Microsystems Engineering, Laboratory for Design of Microsystems*, Freiburg, Germany.

Ratovelomanana, F . , et al., "An All-Optical Wavelength-Converter with Semiconductor Optical Amplifiers Monolithically Integrated in an Asymmetric Passive Mach-Zehnder Interferometer", *IEEE Photonics Technology Letters*, vol. 7, No. 10, (Oct. 1995).

Soitec "Innovative Process for materials treatments Smart Cut", http://222.soitec.com/en/technology/innovative-process.php, (2010).

Xu, Qianfan, et al., "12.5 Gbit/s Carrier-Injection-Based Silicon Mircoring Silicon Modulators", *Optics Express, Optical Society of America*, vol. 15, No. 2, Jan. 22, 2007, pp. 430-436.

Zahler, J. , et al., "Wafer Bonding and Layer Transer Processes for High Efficiency Solar Cells", *NCPV and Solar Program Review Meeting*, 2003, NREL/CD-520-33586, pp. 723-726.

*International Search Report and Written Opinion for PCT/US2010/044139*, mailed Feb. 28, 2011, 9 pages.

First Office Action dated Oct. 10, 2012 (+English translation), in Chinese Patent Application No. 201010294306.4, 13 pages.

\* cited by examiner

OPTICAL MODULATOR UTILIZING WAFER BONDING TECHNOLOGY

TECHNICAL FIELD

Embodiments of the invention generally relate to the field of electronic devices and, more particularly, to a method and apparatus for an optical modulator utilizing wafer bonding technology.

BACKGROUND

Optical-based technologies are increasingly utilized in data transmission as Internet and other data networks carry greater amounts of data. Among the elements utilized in such technologies are optical modulators, which are electronic devices that modulate beams of light.

In particular, a device such as a metal-oxide-semiconductor (MOS) capacitor structure embedded in a silicon waveguide may be utilized to produce high-speed optical phase modulation. A silicon optical modulator is based on modulation of the refractive index of silicon.

In conventional optical modulators, polycrystalline silicon (commonly referred to as polysilicon, poly-Si, or poly) is used in fabrication of a device, the polysilicon providing the light carrying waveguide medium that is modulated in the device. Polysilicon is composed of multiple silicon crystals, and may be deposited on a semiconductor wafer through certain processes such as pyrolyzing silane at certain required temperatures.

However, the use of polysilicon in an optical modulator results in high optical loss through the polysilicon waveguide. The optical losses thereby limit the usefulness of the material for optical modulation devices, particularly for devices intended to operate at high speeds where the optical losses become greater. Further, the use of polysilicon can cause difficulties in fabrication of devices for high speed communications and interconnect applications, including difficulties in bonding of other components in an apparatus.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
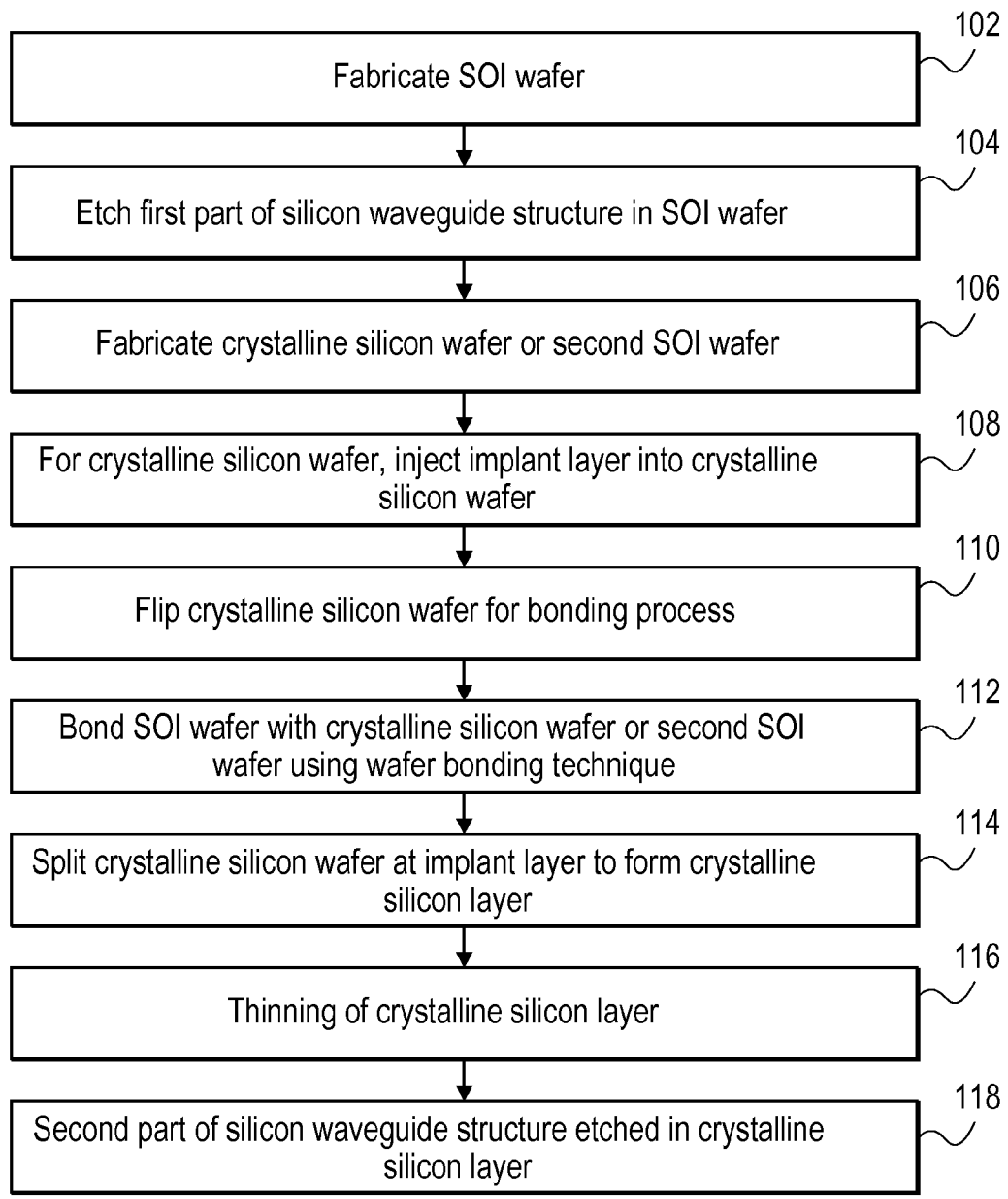
FIG. 1 is a flowchart illustrating an embodiment of fabrication of an optical modulator.

Embodiments of the invention are generally directed to an optical modulator utilizing wafer bonding technology.

As used herein:

"Optical modulator" means a device to modulate intensity of a beam of light. Optical modulators include semiconductor devices, including devices utilizing MOS (metal oxide semiconductor) technology.

In some embodiments, a process for fabrication of an optical modulator includes the use of crystalline silicon for waveguide formation. In some embodiments, a process includes the bonding of a layer of crystalline silicon wafer of a wafer to another wafer using wafer bonding and wafer transfer technology. In some embodiments, an optical modulator device apparatus includes a crystalline silicon wafer or silicon-on-insulator (SOI) wafer bonded to a second wafer using a wafer bonding technique. In some embodiments, a device includes a MOS capacitor optical modulator having a crystalline silicon layer bonded by an oxide layer to a silicon layer of a silicon-on-insulator (SOI) component.

A silicon optical modulator makes use of modulation of the refractive index of silicon occurring via the free carrier plasma dispersion effect. For example, through injection or depletion of electrons and holes in a silicon optical waveguide, a free carrier density change causes optical phase modulation on the light passing through the waveguide. To achieve the free carrier density required for optical modulation in silicon, possible device configurations that have been proposed include forward biased PIN diode (having a nearly intrinsically pure silicon region between a p-type semiconductor region and an n-type semiconductor region), reverse biased PN junction, and meal-oxide-semiconductor (MOS) capacitor. In some embodiments, an optical modular device utilizes MOS capacitor technology. A forward biased PIN diode provides high phase modulation efficiency, but the device speed is usually limited in such technology. While both reverse biased PN junction and MOS capacitor devices may provide high speed operational capabilities (in some implementations providing 40 Gigabit per second operation), the MOS capacitor phase shifter has a much higher phase efficiency compared to the reversed biased PN junction, thereby providing advantages for an optical modulator device.

However, a major limitation in conventional fabrication and utilization of a MOS capacitor structure is the common use of a polysilicon layer that is deposited on top of a gate oxide (insulator). In some embodiments, the polysilicon layer in an optical modular structure may be replaced with a crystalline silicon layer. The poly-Si layer has a much higher optical loss compared to crystalline silicon. In some embodiments, a wafer bonding technique is used to bond a crystalline silicon wafer or SOI wafer to another wafer, thereby allowing for the replacement of the poly-Si layer by a layer of crystalline silicon. In some embodiments, a gate oxide for the MOS capacitor is also formed during the wafer bonding process. In some embodiments, the doping levels of the silicon layers on both sides of the gate oxide may be controlled more precisely than in conventional, which may assist in achieving desired modulator performance.

In a conventional process or device, a MOS capacitor based silicon modulator is fabricated using a layer of polysilicon deposited on top of a gate oxide layer. In a conventional process or device, a major challenge is presented by the high optical loss of doped polysilicon layer, which may be on the order of 10 decibels per centimeter for undoped polysilicon. The optical loss is even greater for doped polysilicon. In addition, polysilicon has a relatively low dopant activation rate. Therefore, a much higher doping level is needed for polysilicon to obtain the same activated dopant concentration as that for crystalline silicon. For higher speed operation, such as operations in excess of 25 Gigabits per second, the use of polysilicon may be difficult or infeasible because the higher doping levels that are required for such speeds result in an additional optical losses that may not be acceptable for an optical modulator.

In addition, the use of polysilicon in devices may create other difficulties. For example, there are issues relating to the integration of polysilicon with other silicon photonics components such as hybrid silicon lasers, one of the key components for integrated photonic chips. A hybrid silicon laser is a semiconductor laser fabricated using silicon and group III-V semiconductor materials. Group III-V semiconductor materials are semiconductors utilizing a compound of a group III material (an element in Group III of the periodic table) and a group V material (including an element in Group V of the periodic table), with Group III-V semiconductor materials include materials such as Indium phosphide and Gallium arsenide. Bonding a group III-V compound semiconductor on polysilicon is difficult, and may provide questionable reliability.

In some embodiments, a silicon modulator incorporates crystalline silicon as the medium for a waveguide. Crystalline silicon (single crystalline silicon or epitaxial (EPI) silicon) is composed of a single crystal of silicon. Crystalline silicon provides significantly lower optical loss in transmission through the material in comparison with polysilicon, with the loss generally being less than one-tenth of the optical loss provided by polysilicon.

However, to utilize crystalline silicon in an optical modulator a process is required to successfully bond the crystalline silicon to other component materials. In some embodiments, crystalline silicon is bonded with a thin oxide to a silicon surface of a silicon-on-insulator (SOI) wafer using wafer bonding and wafer transfer technology to fabricate an optical modulator structure. For example, plasma assisted wafer bonding is a process in which two wafers are exposed to an oxygen plasma before being pressed together at a temperature that is relatively low for semiconductor manufacturing (a temperature in the range of 300 degrees Celsius) for a certain time period in order to bond the two wafers together. Plasma assisted wafer bonding has been utilized in fabrication of certain components, such as the fabrication of a hybrid silicon laser. In some embodiments, a crystalline silicon wafer or second SOI wafer with crystalline silicon layer is bonded to the SOI wafer using an oxygen plasma assisted wafer bonding technique in order to fabricate an optical modulator structure.

In some embodiments, through the use of wafer bonding and wafer transfer technology, a polysilicon layer that would be used in a conventional silicon optical modulator based on MOS capacitors may be replaced by crystalline silicon. The use of crystalline silicon in the fabrication of a silicon optical modulator may be utilized to dramatically reduce optical loss in the transmission of light through the material and to increase the speed operation of operation. In some embodiments, through use of wafer transfer technology in the fabrication of a device, certain device fabrication difficulties may be avoided or reduced, including, for example, doping activation, silicon layer thickness variation, and other issues. In some embodiments, the fabrication of an optical modulator using wafer bonding technology may allow for controlling the doping level of silicon layers separately before the bonding. In this manner, the doping concentration and profile may be controlled more precisely than in conventional fabrication of silicon modulator devices.

FIG. 1 is a flowchart illustrating an embodiment of fabrication of an optical modulator. In some embodiments, a silicon-on-insulator (SOI) wafer is fabricated for the optical modulator 102. A first part of a silicon waveguide structure is fabricated into the SOI wafer 104. In some embodiments, the fabrication of the first part of the silicon waveguide structure is accomplished including the use of standard lithographic patterning (Litho) and reactive ion etching (RIE) techniques, the fabrication including the etching of a channel in a top silicon layer of the SOI wafer. In some embodiments, the fabrication of the first part of silicon waveguide structure include filling such etched channel with insulator material, and in some embodiments the etched channel is not filled and air acts as an insulator.

In some embodiments, a crystalline silicon wafer is fabricated for the optical modulator 106, and a hydrogen implant layer is injected in the top of the crystalline silicon wafer 108. In some embodiments, a second SOI wafer is fabricated for the optical modulator. In some embodiments, if a crystalline silicon wafer has been fabricated, the crystalline silicon wafer is flipped from top to bottom for bonding 110. The SOI wafer is bonded with the crystalline silicon wafer or second SOI wafer with a thin oxide using a wafer bonding technique to form a combined structure 112, with the wafer bonding techniques including, for example, as the wafer bonding technique that is described above. In some embodiments, the oxide bond layer between the two wafers may be in the range of a few nanometers thick and serves as the gate oxide of the MOS capacitor.

In some embodiments, if a crystalline silicon wafer has been used in the combined structure, then after the bonding process is completed the crystalline silicon wafer of the combined structure is split at the implant layer to form a crystalline silicon layer on a surface of the combined structure 114. The split may be accomplished using Smart Cut™ technology, a process to provide for the transfer of fine layers of crystalline material onto a mechanical support. The result of the split is a thin layer of single crystalline silicon on a surface of the bonding oxide layer. If a second SOI wafer is bonded, the thin layer of single crystalline silicon is a layer of the second SOI wafer. In some processes, the crystalline silicon layer may be approximately 200 nm thick. In some embodiments, the crystalline silicon layer is thinned to produce a thinner layer of crystalline silicon 116. In some embodiments, the crystalline silicon layer is thinned using a known thinning technology, such as, for example, chemical-mechanical polishing (CMP) or by oxidizing and etching. In some embodiments, a second part of the silicon waveguide structure is fabricated in the crystalline silicon layer, thereby completing the silicon waveguide structure 118. In some embodiments, the fabrication of the second part of the silicon waveguide structure is accomplished using standard Litho and RIE techniques, the fabrication including etching of a portion of the crystalline silicon layer.

Figure 2:
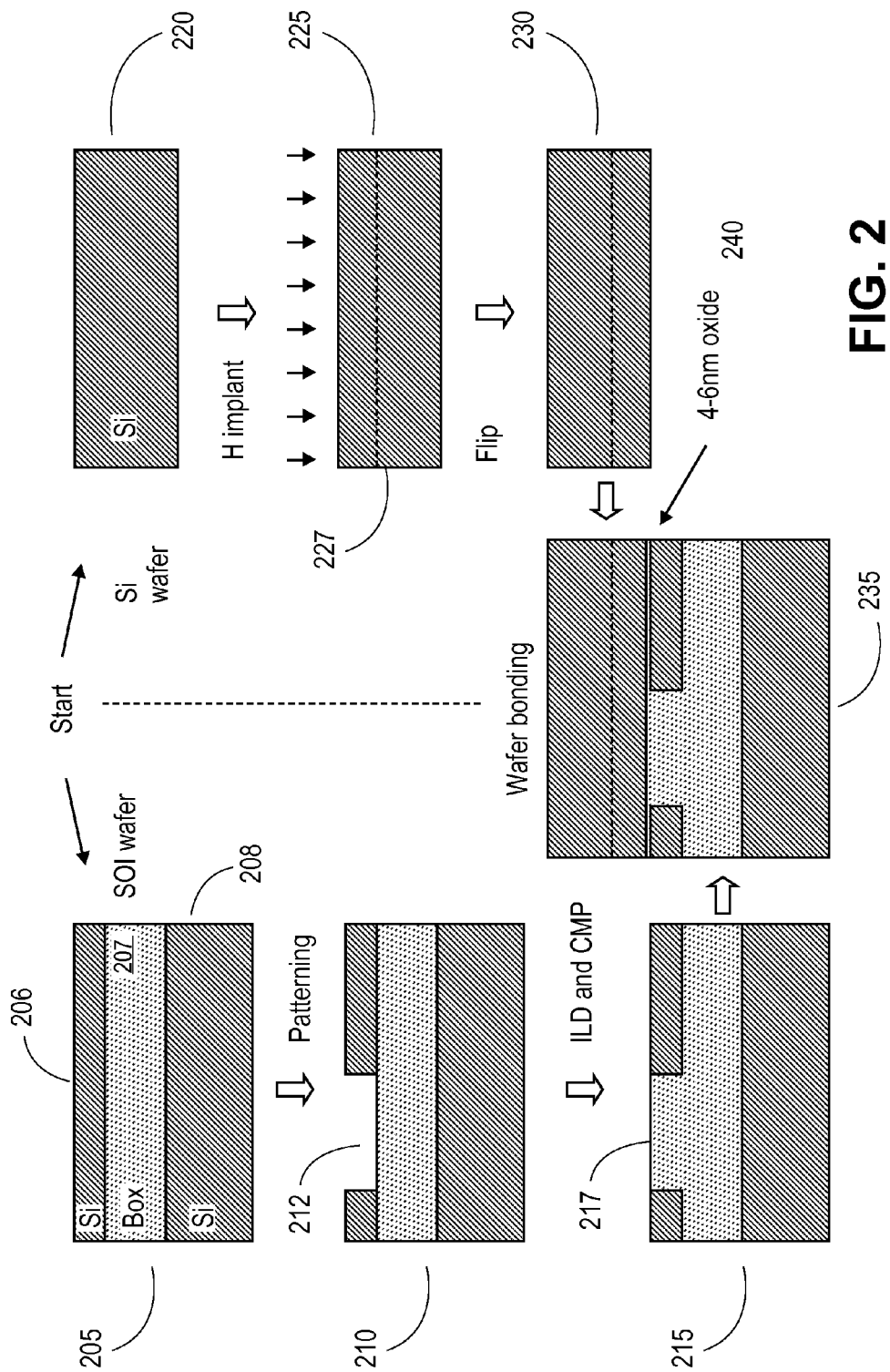
FIG. 2 is an illustration of a first set of processes for an embodiment of fabricating an optical modulator structure.

FIG. 2 is an illustration of a first set of processes for an embodiment of fabricating an optical modulator structure. In some embodiments, a silicon-on-insulator wafer 205 is formed, which, as illustrated, includes an insulator 207 layer interposed between two layers of silicon, 206 and 208. The SOI wafer 205 may be fabricated using various technologies. As illustrated, the insulator 207 is a BOX (Buried OXide) layer formed in the SOI wafer. In some embodiments, a first part of a silicon waveguide is fabricated in the SOI wafer. As described above, the fabrication of the first part of the silicon waveguide may be accomplished using standard Litho and RIE techniques. In this illustration, a channel 212 is formed in the SOI wafer 210, which in some embodiments is then filled with insulator material using, for example, an interlayer dielectric (ILD) applied and formed 217 using chemical mechanical processing (CMP) in the SOI wafer 215. In some embodiments, the channel 212 is etched but is not filled with insulator material, with air acting as the insulator.

In some embodiments, a crystalline silicon wafer is prepared 220, with a hydrogen implant layer 227 being injected via the top of the wafer 225. In some embodiments, a second SOI wafer us prepared. In some embodiments, the crystalline silicon wafer may then be flipped over 230 (after which the side of the wafer for which the hydrogen implant layer is closer to the surface becomes the bottom surface). In some embodiments, the SOI wafer is bonded with the crystalline silicon wafer or second SOI wafer with a thin oxide using a wafer bonding technique to form a combined structure 235, with the wafer bonding techniques including, for example, as the wafer bonding technique that is described above. In this illustration, the oxide bond layer 240 formed between the two wafers in the wafer bonding process may be in the range of 4-6 nanometers thick, and serves as the gate oxide of the MOS capacitor.

Figure 3:
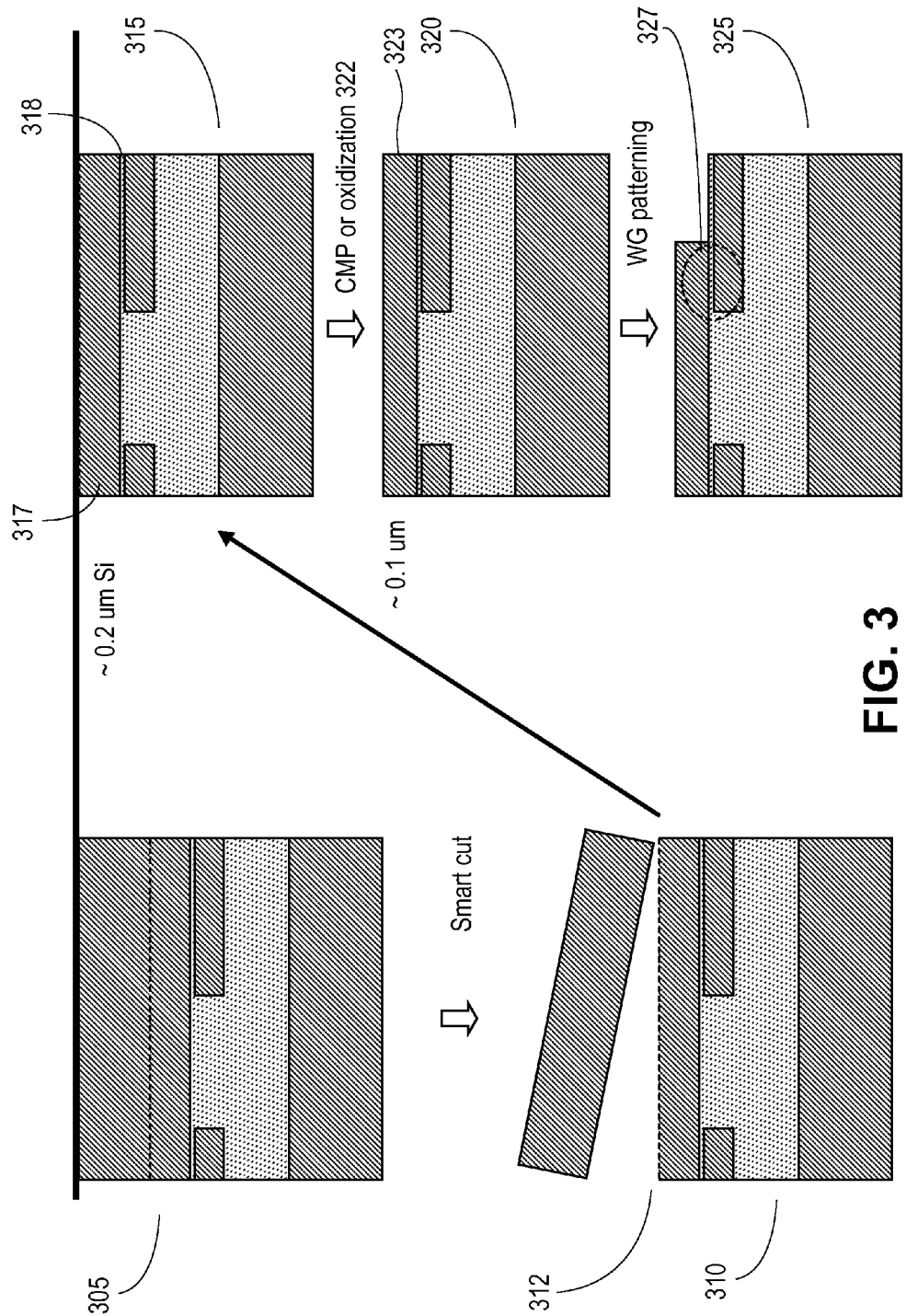
FIG. 3 is an illustration of a second set of processes for an embodiment of fabricating an optical modulator structure subsequent to wafer bonding.

FIG. 3 is an illustration of a second set of processes for an embodiment of fabricating an optical modulator structure subsequent to wafer bonding. In this illustration, the combined structure 305 (such as illustrated as element 235 in FIG. 2) has been formed by wafer bonding. In some embodiments, if a crystalline silicon wafer was prepared, the combined structure 310 then is split at the implant layer 312 of the crystalline silicon wafer of the combined structure to form a crystalline silicon layer 317. The result of the split is a thin layer of single crystalline silicon 317 on a surface of the bonding oxide layer 318. In some processes, the crystalline silicon layer may be approximately 200 nm thick. In some embodiments, if a second SOI wafer is bonded, the thin layer of single crystalline silicon is a layer of the second SOI wafer. In some embodiments, the crystalline silicon layer may be subjected to a thinning process 322 to further thin the layer of crystalline silicon 323 on the combined structure 320. In some embodiments, the crystalline silicon layer 323 is thinned using chemical-mechanical polishing or by oxidizing and etching.

In some embodiments, a second part of the silicon waveguide is fabricated or has been previously fabricated in the crystalline silicon layer or second SOI wafer, thereby completing the silicon waveguide structure 327 in the optical modulator structure 325. In some embodiments, the fabrication of the second part of the silicon waveguide structure is accomplished using standard Litho and RIE techniques.

Figure 4:
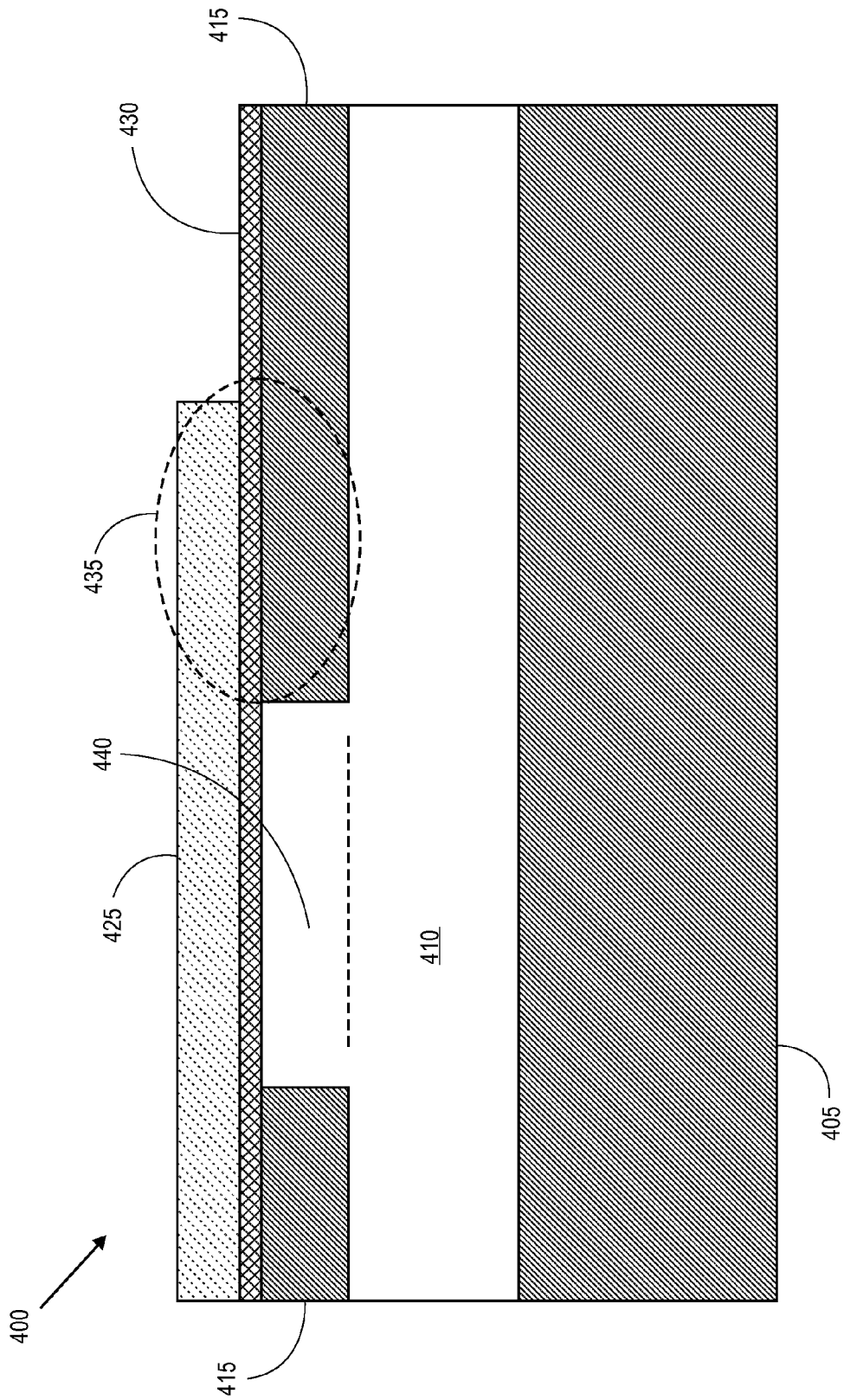
FIG. 4 is an illustration of an embodiment of an optical modulator structure with wafer bonding.

FIG. 4 is an illustration of an embodiment of an optical modulator structure with wafer bonding. In this illustration, an embodiment of an optical modulator structure 400 includes a silicon-on-insulator portion including a first silicon layer 405, an insulator layer 410, and a second silicon layer 415, a channel in the second silicon layer being filled with insulator material 440 to form a first part of a waveguide 435.

In some embodiments, the optical modulator structure 400 further includes an oxide layer 430 resulting from bonding of a crystalline silicon layer 425 to the second silicon layer 415. In some embodiments the oxide layer is a wafer bonding layer between the second silicon layer 415 and the crystalline silicon layer 425, such as an oxygen plasma bond between such layers. In some embodiments, the crystalline silicon layer 425 includes an etched portion to complete the waveguide 435.

Figure 5:
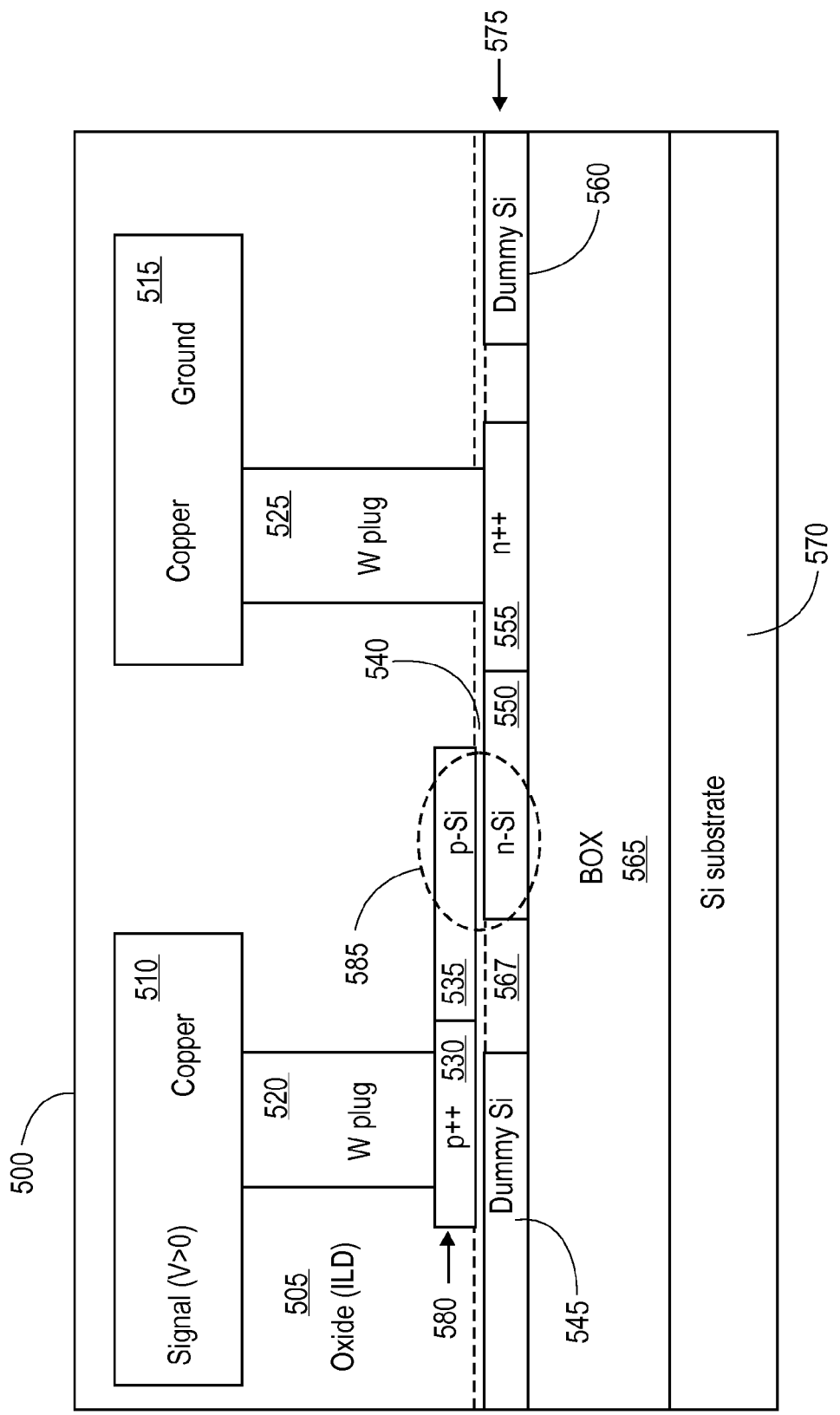
FIG. 5 is an illustration of an embodiment of a MOS capacitor optical modulator device.

FIG. 5 is an illustration of an embodiment of a MOS capacitor optical modulator device based on wafer bonding and layer transfer technology. In this illustration, a MOS capacitor optical modulator device 500 includes a BOX insulator layer 565 between a silicon substrate 570 and a silicon layer 575 including an n-type silicon semiconductor region 560, a heavily doped n++ region (with concentrated n-type impurity), and dummy silicon regions 545 and 560. The dummy silicon regions are electrically isolated from the p- and n-doped regions in the MOS capacitor modulator. The dummy silicon regions serve as mechanical support for the doped silicon layer in connection with the use of metal contacts. In some embodiments, the device may further include insulator region 567 etched and filled between the sections of the silicon layer 575. In some embodiments, the insulator region 567 is air, with the silicon layer 575 being etched but not filled with insulator material. The use of air may assist in the layer transfer and wafer bonding, as there is no wafer planarization needed before the bonding process. The device further includes a crystalline silicon layer 580 comprising, for example, a p-type silicon semiconductor region 535 and a heavily doped p-++ region 530, which is bonded to the silicon layer 575 by an oxide layer 540, such as an oxide layer formed utilizing a wafer bonding technique between the crystalline silicon layer 580 and the silicon layer 575. However, it will be appreciated by those of skill in the art that the polarities illustrated are provided for explanatory purposes and that the polarities of the dopants and the corresponding voltages may be reversed. In some embodiments, the oxide layer 540 forms the gate oxide for the MOS capacitor structure of the device 500. The silicon layer 575 and crystalline silicon layer 580 include channels to form a waveguide 585 for the optical modulator. In some embodiments, the p-type and n-type doped regions provided in FIG. 5 may be exchanged.

In some embodiments, the MOS capacitor optical modulator device 500 further comprises an interlayer dielectric (ILD) oxide region 505 into which is formed a first plug 520 to couple a first copper element 510 (for application of a signal voltage, V>0 in this illustration) with the p++ region 530, which is in turn coupled with the p-Si region 535. The device 500 further comprises a second plug 525 to couple a second copper contact 515 (for application of a ground voltage potential) with the n++ region 555, which is in turn coupled with the n-Si region 550. The MOS capacitance thus is formed between the p-Si region 535 and the n-Si region 550.

Figure 6:
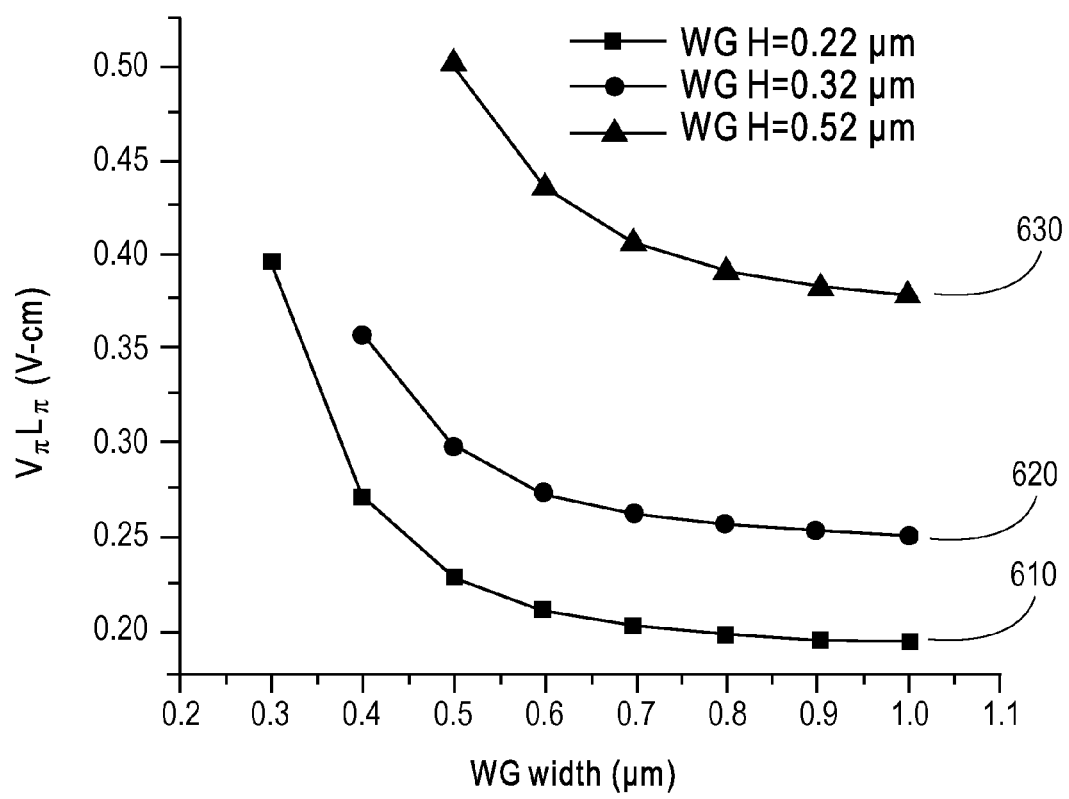
FIG. 6 is an illustration of phase efficiency characteristics for certain embodiments of optical modulators.

FIG. 6 is an illustration of phase efficiency characteristics for certain embodiments of optical modulators. In this illustration, a modeled phase efficiency of a MOS capacitor phase modulator for various waveguide dimensions is shown. In some embodiments, the MOS capacitor phase modulator includes a crystalline silicon component that is bonded to an SOI component using wafer bonding technology.

In FIG. 6, $V_\pi L_\pi$ properties, signifying efficiency (measured in volt-centimeters), versus the waveguide width (in micrometers) are shown for various wave guide heights. As shown, the waveguide heights are 0.52 μm (610), 0.32 μm (620), and 0.22 μm (630). As shown, for a small waveguide with height of 0.22 um, an efficiency of $V_\pi L_\pi$ of ~0.2 V-cm can be achieved. However, the $V_\pi L_\pi$ of a reverse biased PN junction is typically an order of magnitude larger, providing much lower efficiency.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs which are not illustrated or described.

Various embodiments of the present invention may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments of the present invention may be provided as a computer program product, which may include a computer-readable medium having stored thereon computer program instructions, which may be used to program a computer (or other electronic devices) to perform a process according to the embodiments of the present invention. The machine-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of media/machine-readable medium suitable for storing electronic instructions. Moreover, the present invention may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

The invention claimed is:

1. A method comprising:
   etching a silicon on insulator (SOI) wafer to produce a first part of a silicon waveguide structure on a first surface of the SOI wafer;
   preparing a second wafer, the second wafer being a crystalline silicon wafer having a first surface of crystalline silicon and having an implant layer;
   bonding the first surface of the second wafer with a thin oxide to the first surface of the SOI wafer using a wafer bonding technique; and
   splitting the crystalline silicon wafer at the implant layer, wherein splitting the crystalline silicon wafer results in a layer of crystalline silicon above the oxide bonding layer;
   wherein a second part of the silicon waveguide structure is etched in the layer of crystalline silicon.

2. The method of claim 1, wherein the implant layer of the crystalline silicon wafer is a hydrogen implant layer.

3. The method of claim 1, wherein splitting the crystalline silicon wafer include splitting utilizing Smart Cut™ technology.

4. The method of claim 1, wherein the wafer bonding technique is an oxygen plasma assisted technique.

5. The method of claim 1, wherein etching the first part of the waveguide structure in the SOI wafer includes lithography and reactive ion etching.

6. The method of claim 1, wherein forming the second part of the silicon waveguide structure includes thinning the layer of crystalline silicon.

7. The method of claim 6, wherein thinning the layer of crystalline silicon includes one or more of a chemical-mechanical polishing process or an oxidizing and etching process.

8. The method of claim 1, wherein etching the second part of the waveguide structure includes lithography and reactive ion etching.

* * * * *